United States Patent [19]
Puig et al.

[11] Patent Number: 6,059,164
[45] Date of Patent: May 9, 2000

[54] INSERTION HEAD FOR PINS OF DIFFERENT LENGTHS

[75] Inventors: Josep Altes Puig, Tarragona; Miguel Lazpiur Lamariano, Guipuzcoa, both of Spain

[73] Assignee: Lear Automotive Dearborn, Inc., Southfield, Mich.

[21] Appl. No.: 09/018,705

[22] Filed: Feb. 4, 1998

[51] Int. Cl.⁷ .............................. B25C 5/02; H01P 43/00
[52] U.S. Cl. ............................ 227/76; 227/84; 227/95; 227/97; 227/117; 227/118
[58] Field of Search ................................ 227/84, 86, 87, 227/91, 95, 64, 97, 93, 76, 117, 118; 29/739, 845

[56] References Cited

U.S. PATENT DOCUMENTS

| | | | |
|---|---|---|---|
| 3,134,982 | 6/1964 | Gagnon et al. | 227/84 |
| 3,257,059 | 6/1966 | Wright et al. | 227/93 |
| 3,302,274 | 2/1967 | Stoltz | 227/118 |
| 3,490,676 | 1/1970 | Willbond | 227/84 |
| 3,710,480 | 1/1973 | Royse et al. | 227/93 |
| 4,501,065 | 2/1985 | Zemek et al. | 227/95 |
| 4,519,534 | 5/1985 | White | 227/117 |
| 4,590,659 | 5/1986 | Yagi et al. | 227/95 |
| 4,905,368 | 3/1990 | Brown | 29/739 |
| 5,361,962 | 11/1994 | Andersen et al. | 227/91 |

*Primary Examiner*—Peter Vo
*Assistant Examiner*—Jun Calve
*Attorney, Agent, or Firm*—MacMillan, Sobanski & Todd, LLC

[57] ABSTRACT

An insertion head assembly adapted to form insert pins of different lengths includes a first body portion including a transport mechanism for supplying wire to be formed into pins and a pair of jaws operatively connected to the transport mechanism having a beak disposed on each of the jaws. The jaws and the beaks open and close to score wire passing therebetween thereby forming the pins. The assembly also includes a second body portion adapted to receive the pin scored by the first body. The second body includes a fluid actuated pin insertion mechanism responsive to the length of the pin having a pin receiver operatively connected to a punch which pushes the pin from the receiver until the pin exits the insertion head assembly.

4 Claims, 3 Drawing Sheets

6,059,164

INSERTION HEAD FOR PINS OF DIFFERENT LENGTHS

TECHNICAL FIELD

The present invention relates to an insertion head for pins of different lengths having novel characteristics of manufacturing, shaping and design to fulfill the object for which it has been specifically designed with a maximum of efficiency and safety.

BACKGROUND

There exists in the market and, therefore, can be considered as the state of the art, insertion machines whose main object is, on the basis of a series of elements among which there is the insertion head, that of inserting, starting with a feeding system, of electrical or electronic components such as pins, bridges, tongues, female clips and the like.

These insertion machines incorporate among other elements a coordinate table moving in four directions as per both X and Y axes. These insertion machines incorporate a rotatable plate on which is situated a printed circuit board which is bound to the plate at the moment that the insertion head proceeds to insert components into the printed circuit board and then proceeds to the insertion operation.

The nature of the insertion heads, with respect to their design is usually determined by the type of elements, either electrical, electronic or the like, which must be inserted in the printed circuit board. That is, the geometric and physical nature of the elements determines the specific design of each head, and, because of that, even if the majority of those insertion heads found in the market have the same function, their internal design can vary greatly.

In Spanish Patent of Invention No. 9 00 966 an automatic head for the insertion of legs in printed circuit boards is disclosed which feeds wire from a wire roll or the like, cuts the wire properly, approximates or adapts the legs once they are cut, and then inserts the legs into a printed circuit board.

SUMMARY OF THE INVENTION

An object of the present invention is to improve the design insertion heads of the type disclosed in the above patent and other similar drivers. The improved insertion heads are simplified by reducing the number of elements required for performing the task while allowing for the use of pins of various lengths to be inserted without changing the insertion head. This will provide a savings of time as well as the increasing of the specific efficiency of the insertion machine. The invention heads according to the present invention can be used in combination with other machines which feed circuit boards of varying dimensions to further increase the efficiency of the entire process.

The design simplifications over what is considered to be the state of the art basically involve carrying out the insertion task with a head with only two hydraulic or pneumatic cylinders. By reducing the complexity of the design, the construction cost and cost of the insertion head is much lower and, consequently, reduces the amount of adjustments required to fine tune the insertion head.

Basically, the insertion head is comprised of sets of straightener rollers, placed at 90° to one another, which allow the simultaneous alignment and straightening of a wire. After this operation, the wire is introduced into a central body of the head where it is fed by a pneumatic feeder to the opposite end of the insertion head. Then corresponding jaws perform a conformation operation on the ends of the wire without cutting the wire. The jaws follow the wire up to a conduit or guide which places the wire into a disc having an interior corresponding slit, which in a known way and by rotation, proceeds to divide each portion of a pin already formed from the remainder of the wire. A conventional punch passes through a corresponding mouth to the insert of the pin into a corresponding printed circuit board placed atop of a corresponding plate or coordinate table.

In this embodiment, the number of pneumatic or hydraulic cylinders which drive the assembly of the insertion head are reduced to only two. The first cylinder hauls the wire arriving from the spool mounted on the insertion machine by means of a corresponding support to introduce the wire into the interior portion of the insertion head and then continues to haul the wire into the vicinity of the jaws, as has been above mentioned. The second of the cylinders acts on a corresponding cam which acts on a runner for pushing a punch and proceeding with the insertion operation itself.

BRIEF DESCRIPTION OF THE DRAWINGS

There follows a report of the several elements numbered in the drawings accompanying the present description: (10) insertion head, (11) jaws, (12) beaks, (13) straighteners set, (14) pneumatic feeder, (15) conduit, (16) mouth, (17) guiding conduit, (18) pin, (19) disc, (20) slot, (21) strut, (22) printed circuit board, (23) plate, (24) punch, (25) pneumatic or hydraulic cylinder, (26) cam, (26a) rotation shaft of the cam (26), (27) crown, (28) pusher, (29) labyrinth, (30) body, (31) feeding mouth, (32) conduit, (33) shaft, (34) bar, (36) device, (37) crown, (37a) perimeter, (38) protuberances, (39) ends of (11), (40) arm, (41) bolts.

Other details and characteristics of the present application will be manifest through the reading of the description given here below when considered in connection with the accompanying discovery wherein.

DETAILED DESCRIPTION OF THE INVENTION

Figure 1:
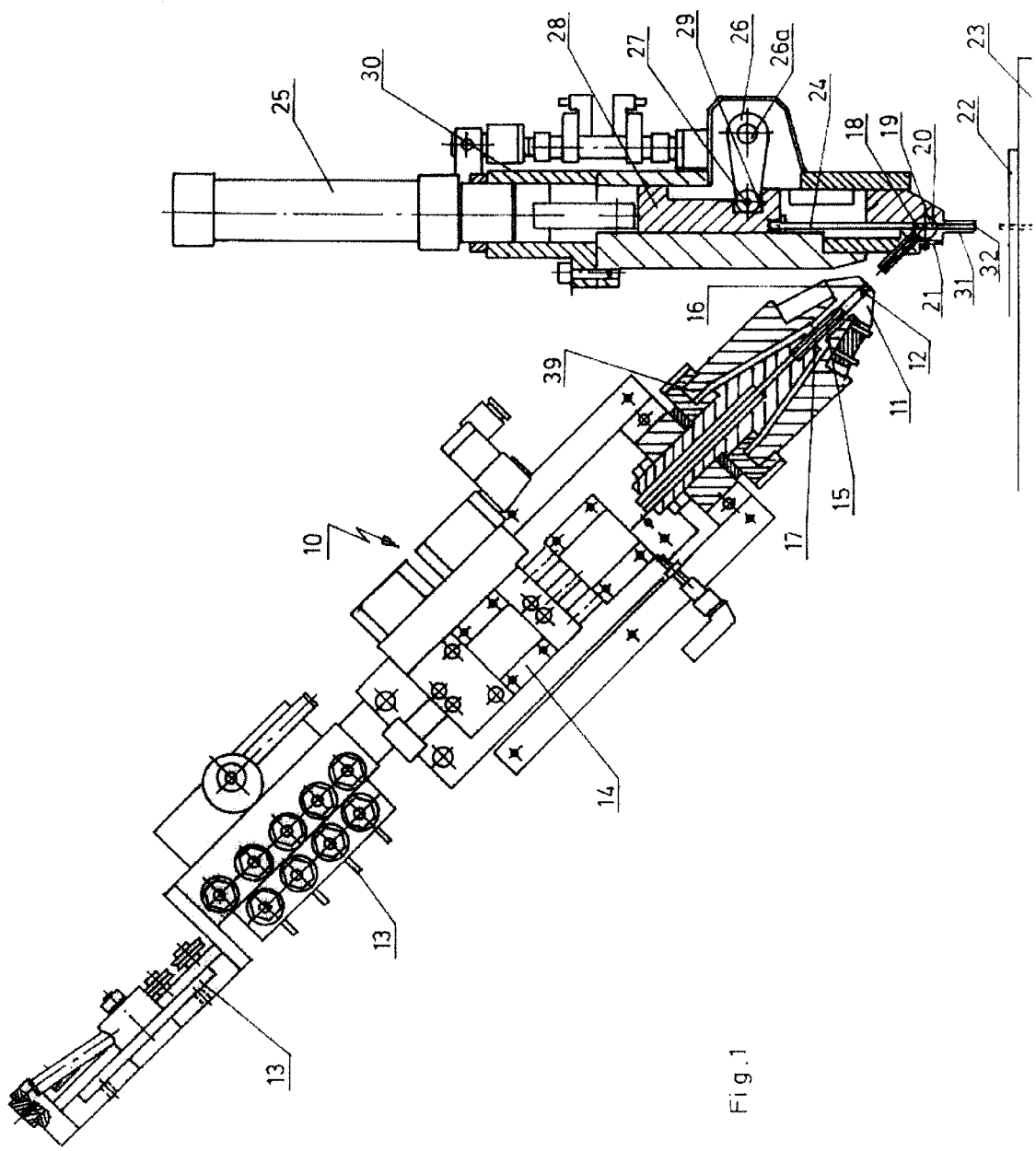
FIG. 1 is a front elevation cut lengthwise through the assembly of the insertion head (10)

Referring to FIG. 1, a preferred embodiment of the present invention is shown. An insertion head (10) is formed with two bodies. The first body represented in an inclined form on the left side of the Figure which functions to straighten and feed a wire to the insertion head itself. The second body, represented in the right side of the Figure, and in a vertical position, has the function of cutting the wire after the wire is pre-treated or straightened to form a pin by the other body and then it separates the pin from the remainder of the wire and proceeds to nail or insert the pin in a corresponding printed circuit board (22) placed on top of a plate (23).

Figure 5:
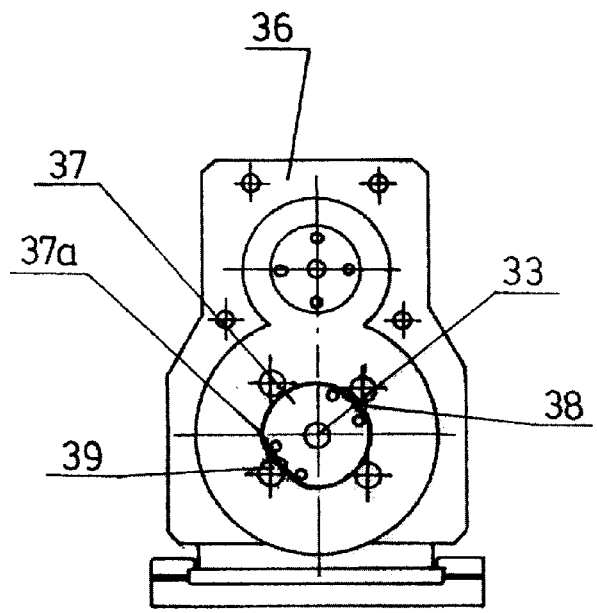
FIG. 5 is an elevational cross-section of a device (36) acting on jaws (11).

The body situated on the left of the head (10) includes a set of straighteners (13) constructed of conventional rollers wherein each set is situated at 90° to one another. The object of this first body is to transport the wire, supplied by a conventional roll, through a support to the insertion head. A pneumatic feeder (14) grips the wire and serves to advance the wire toward the interior portion of the insertion head and to overcome the friction force imposed by the straighteners (13). The continuous action of the pneumatic feeder (14), which grips the wire by known means, advances the wire up to a mouth (16) and introduces the wire into a conduit (15) until the wire is aligned with beaks (12) dropped on jaws (11). Jaws (11) open and close in combination with the device (36) which is shown in FIG. 5 and which will be discussed below in greater detail. The beaks (12) produce score lines or perimeters of splitting in the wire passing between them and follow the wire until it is positioned in a guide conduit (17) as shown in FIG. 1. A disc (19) provided with a slot (20) is aligned with the guide conduit (17) and is rotated by an arm (40) and the pusher (28), breaking and separating the pin (18) at the weakened point of the wire and aligns the pin (18) with a punch (24). The punch (24) is pushed by the action of the pneumatic or hydraulic cylinder (25) thereby nailing or inserting the pin (18) into the printed circuit board (22).

The device (36) as shown in FIG. 5, drives the jaws (11) through their ends (39) urging the ends to rotate from the inside outwards and vice versa by the action of a crown (37) having a perimeter (37a), when the crown (37) rotates about shaft (33).

The perimeter (37a) of the crown (37) includes regularly spaced protuberances (38) which displace the ends (39) of the jaws (11) compelling the beaks (12), set in the interior portions of jaws (11), to produce slits in the full cross-section of the wire when the jaws (11) come together over the wire.

The device (36) allows for the regulation of the run or travel of the jaws (11). Only a change of the crown (37) on shaft (33) allows the same head (10) to be used with different wire or bar thicknesses for the formation of the pins without requiring a change of the entire head thus providing greater versatility to the insertion head of the present invention.

A further object of the invention, as has been explained in the earlier portion of this description, includes the ability of the disclosed head to, in addition to the above functions, be able to work with pins (18) of varying lengths. This ability adds greater versatility to the insertion head (10) and also makes the head (10) more cost effective.

Figure 4:
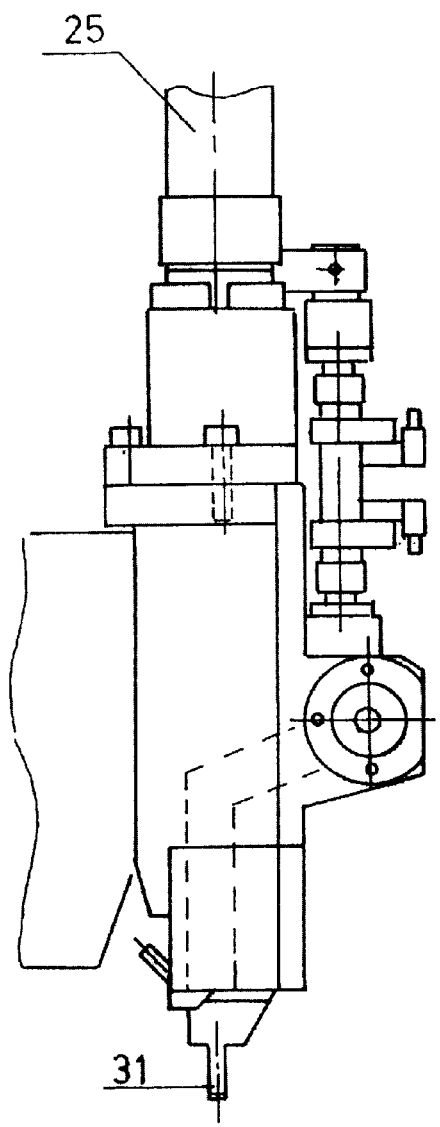
FIG. 4 is a side elevational view of one of the bodies of the head (10)

As can be seen in FIGS. 1 and 4, the ability of the head (10) to be used with pins (18) of varying lengths resides in a cam (26) which rotates about a rotation shaft (26a). The cam (26) includes a crown (27) disposed at one end thereof which includes an outside cylindrical surface which drives the pusher (28). The pusher (28) in combination with a labyrinth (29) allows different run lengths of the punch (24) which nails or inserts, in a known manner, the pin (18) into the printed circuit board (22) disposed over a corresponding anvil which is not shown in the Figures.

Figure 3:
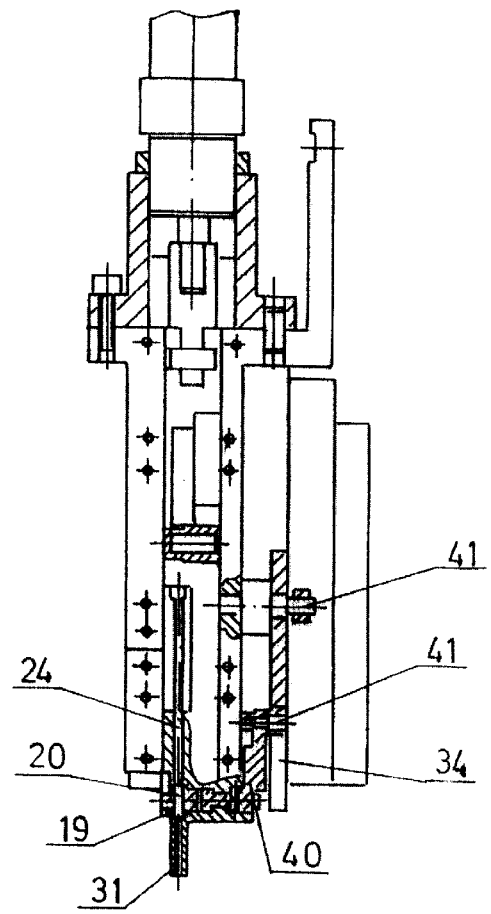
FIG. 3 is a partial cross-section of one of the bodies of the head (10)

The punch (24), which is operatively connected to the pneumatic or hydraulic cylinder (25), pushes the pin (18) disposed in the slot (20) of the disc (19) as shown in FIG. 3, and compels the pin (18) to exit through a feeding mouth (31). The length of the pin (18) depends on the length of the run of the pneumatic feeder (14) and its downward course, in combination with the displacement produced by the cam (26) over the pusher (28) which causes the punch (24) to push the pin (18), until the pin (18) exits the head.

Figure 2:
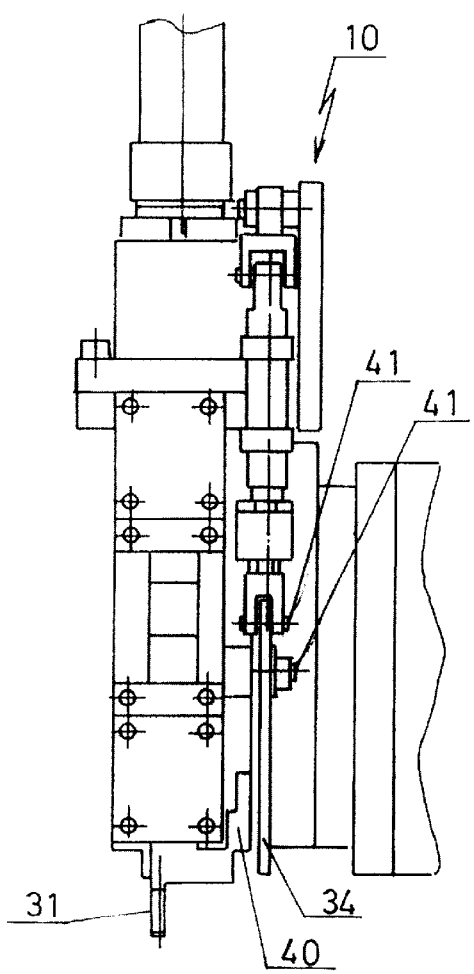
FIG. 2 is a rear view of the insertion head (10), as shown in FIG. 1, showing the driving and rotation system of disc (19), pusher (28), and arm (40)

As can be seen in FIGS. 2 and 3, the movement of the disc (19) is produced by the arm (40), which is joined to the bar (34) with bolts (41). The coordination between the elements which cause the rotation of the disc (19) are also coordinated with that of the pneumatic feeder (14) and the device (36) which allows the opening and closing of the jaws (11). This coordination provides that once the beaks (12) have produced the slit or score of the corresponding bar or wire, and bar or wire has been advanced through the interior of the guide conduit (17), the slot (20) is aligned with the guide conduit (17) in order to receive the pin (18) at least partially produced by the rotating action of the slot (20) and separates the pin (18) from the remainder of the bar and with operative cycles similar to that disclosed above, continues the operative cycle of the insertion head.

In order to produce pins (18) of different lengths, only the run of the punch (24) needs to be adjusted. A longer or shorter run will produce the longer or shorter length of insertion of the pins (18), respectively, to be inserted into printed circuit board (22).

A preferred embodiment of this invention has been disclosed; however, one of ordinary skill in the art would recognize that certain modifications would come within the scope of this invention. For that reason, the following claims should be studied in order to determine the true scope and content of this invention.

What is claimed is:

1. An insertion head assembly adapted to form wire pins of different lengths, said assembly comprising:

a plate having a generally planar surface adapted to support a printed circuit board into which at least one pin formed from wire is to be inserted;

a first body portion having a conduit for guiding wire and being positioned with said conduit inclined relative to said surface of said plate, said first body including a feeder for supplying wire to be formed into pins through said conduit, a pair of jaws adjacent said feeder and having a beak disposed on each of said jaws, said jaws and said beaks opening and closing to score wire passing therebetween thereby fixing a predetermined length for the pin; and a second body portion extending generally transverse to said surface of said plate for receiving a free end of the wire and having a punch movable along a selected run length, said second body portion having means for breaking the wire at said score to separate the pin from the wire and aligning the pin with said punch, said second body portion including means for moving said punch toward said surface of said plate said selected run length whereby said selected run length is determined by the predetermined length of the pin in order to insert the pin into a printed circuit board resting on said surface of said plate.

2. The assembly according to claim 1 wherein said means for breaking and aligning includes a slotted disc receiving the scored wire in a slot formed in said disc and said means for breaking and aligning rotates said disc to break the scored wire thereby forming the pin.

3. The assembly according to claim 1 wherein said punch is operatively connected to an actuating cylinder by a pusher, said selected run length of said punch being controlled by a cam coupled to said pusher.

4. The assembly according to claim 1 wherein said first body includes a rotatable crown coupled to said jaws for opening and closing said jaws, said crown controlling an amount of travel of said jaws and being replaceable for accommodating wires of different diameters.

* * * * *